US009159735B2

(12) United States Patent
Tsair et al.

(10) Patent No.: US 9,159,735 B2
(45) Date of Patent: Oct. 13, 2015

(54) ARCHITECTURE TO IMPROVE CELL SIZE FOR COMPACT ARRAY OF SPLIT GATE FLASH CELL WITH BURIED COMMON SOURCE STRUCTURE

(71) Applicant: Taiwan Semiconductor Manufacturing Co., Ltd., Hsin-Chu (TW)

(72) Inventors: Yong-Shiuan Tsair, Tainan (TW); Po-Wei Liu, Tainan (TW); Wen-Tuo Huang, Tainan (TW); Yu-Ling Hsu, Tainan (TW); Tsun-Kai Tsao, Tainan (TW); Ming-Huei Shen, Dounan Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/945,002

(22) Filed: Jul. 18, 2013

(65) Prior Publication Data
US 2015/0021679 A1    Jan. 22, 2015

(51) Int. Cl.
*H01L 27/115* (2006.01)
*H01L 29/788* (2006.01)
(Continued)

(52) U.S. Cl.
CPC .... *H01L 27/11517* (2013.01); *H01L 27/11521* (2013.01); *H01L 29/42328* (2013.01); *H01L 29/66825* (2013.01); *H01L 29/788* (2013.01);
(Continued)

(58) Field of Classification Search
CPC ............... G11C 16/0433; H01L 27/11517; H01L 27/11519; H01L 27/11521; H01L 27/11524; H01L 27/1156; H01L 29/784; H01L 29/7841; H01L 29/788; H01L 29/7881; H01L 29/7883; H01L 29/7887; H01L 27/11558

USPC ......................................................... 257/320
See application file for complete search history.

(56) References Cited

U.S. PATENT DOCUMENTS

| | | | | |
|---|---|---|---|---|
| 6,097,076 A | * | 8/2000 | Gonzalez et al. | 257/513 |
| 6,291,297 B1 | | 9/2001 | Chen | |
| 6,512,263 B1 | * | 1/2003 | Yuan et al. | 257/316 |

(Continued)

OTHER PUBLICATIONS

Caleb Yu-Sheng Cho, et al.; "A Novel Self-Aligned Highly Reliable Sidewall Split-Gate Flash Memory"; IEEE Transactions on Electron Devices, vol. 53, No. 3, Mar. 2006, p. 1-9.

*Primary Examiner* — Fernando L Toledo
*Assistant Examiner* — Christine C Lau
(74) *Attorney, Agent, or Firm* — Eschweiler & Associates, LLC

(57) ABSTRACT

Some embodiments of the present disclosure relates to an architecture to create split gate flash memory cell that has lower common source (CS) resistance and a reduced cell size by utilizing a buried conductive common source structure. A two-step etch process is carried out to create a recessed path between two split gate flash memory cells. A single ion implantation to form the common source also forms a conductive path beneath the STI region that connects two split gate flash memory cells and provide potential coupling during programming and erasing and thus electrically connect the common sources of memory cells along a direction that forms a CS line. The architecture contains no OD along the source line between the cells, thus eliminating the effects of CS rounding and CS resistance, resulting in a reduced space between cells in an array. Hence, this particular architecture reduces the resistance and the buried conductive path between several cells in an array suppresses the area over head.

20 Claims, 8 Drawing Sheets

(51) Int. Cl.
  *H01L 29/66* (2006.01)
  *H01L 29/423* (2006.01)
(52) U.S. Cl.
  CPC ......... *H01L 29/7881* (2013.01); *H01L 29/7883* (2013.01); *H01L 29/7885* (2013.01)

(56) References Cited

U.S. PATENT DOCUMENTS

| | | | |
|---|---|---|---|
| 6,747,310 B2 * | 6/2004 | Fan et al. | 257/320 |
| 6,894,339 B2 * | 5/2005 | Fan et al. | 257/314 |
| 6,894,343 B2 * | 5/2005 | Harari et al. | 257/319 |
| 6,936,887 B2 * | 8/2005 | Harari et al. | 257/319 |
| 6,940,152 B2 * | 9/2005 | Arai | 257/649 |
| 6,953,964 B2 * | 10/2005 | Yuan et al. | 257/315 |
| 7,037,787 B2 * | 5/2006 | Fan et al. | 438/267 |
| 8,148,768 B2 * | 4/2012 | Do et al. | 257/315 |
| 8,569,824 B2 * | 10/2013 | Takahashi et al. | 257/324 |
| 8,669,607 B1 * | 3/2014 | Tsair et al. | 257/316 |
| 8,940,604 B2 * | 1/2015 | La Rosa | 438/257 |
| 2003/0073275 A1 * | 4/2003 | Kianian et al. | 438/201 |
| 2006/0183284 A1 * | 8/2006 | Sasago et al. | 438/257 |
| 2011/0049603 A1 | 3/2011 | Pan et al. | |
| 2013/0250700 A2 * | 9/2013 | La Rosa | 365/185.29 |
| 2014/0151782 A1 * | 6/2014 | Tsair et al. | 257/320 |

* cited by examiner

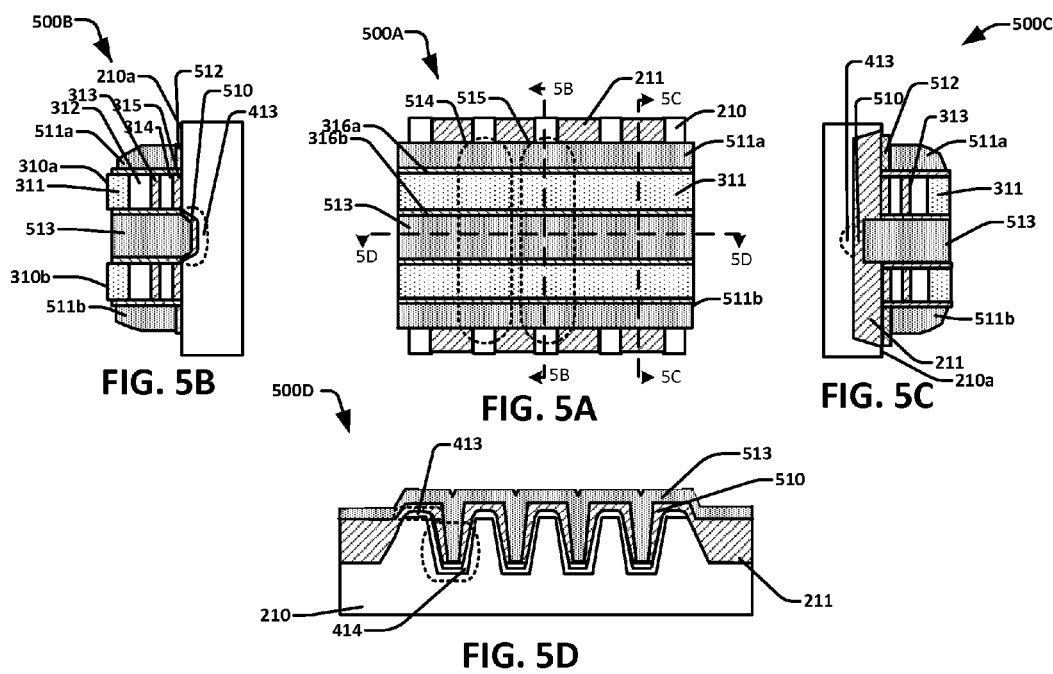

US 9,159,735 B2

ARCHITECTURE TO IMPROVE CELL SIZE FOR COMPACT ARRAY OF SPLIT GATE FLASH CELL WITH BURIED COMMON SOURCE STRUCTURE

BACKGROUND

The present disclosure relates to split gate memory cells used in FLASH EEPROMs (Electrically Erasable Programmable Read Only Memories), and in particular, to an architecture to reduce the cell size for compact array of split gate flash memory cell.

Flash cells are used in a wide variety of commercial and military electronic devices and equipment. In flash memory cells, over erase associated with stacked gate structures is eliminated by the use of a split gate structure. However, such structures and the use of dedicated select and erase gate structures adds to the cell size.

BRIEF DESCRIPTION OF THE DRAWINGS

FIG. 5A shows a top view of some embodiments of a semiconductor surface after deposition and patterning of a poly silicon layer that leads to the formation of select and erase gates.

FIG. 5B shows a cross sectional view of the embodiments of FIG. 5A taken along 5B-5B.

FIG. 5C shows a cross sectional view of the embodiments of FIG. 5A taken along 5C-5C.

FIG. 5D shows a cross sectional view of the embodiments of FIG. 5A taken along 5D-5D.

DETAILED DESCRIPTION

Figure 1:
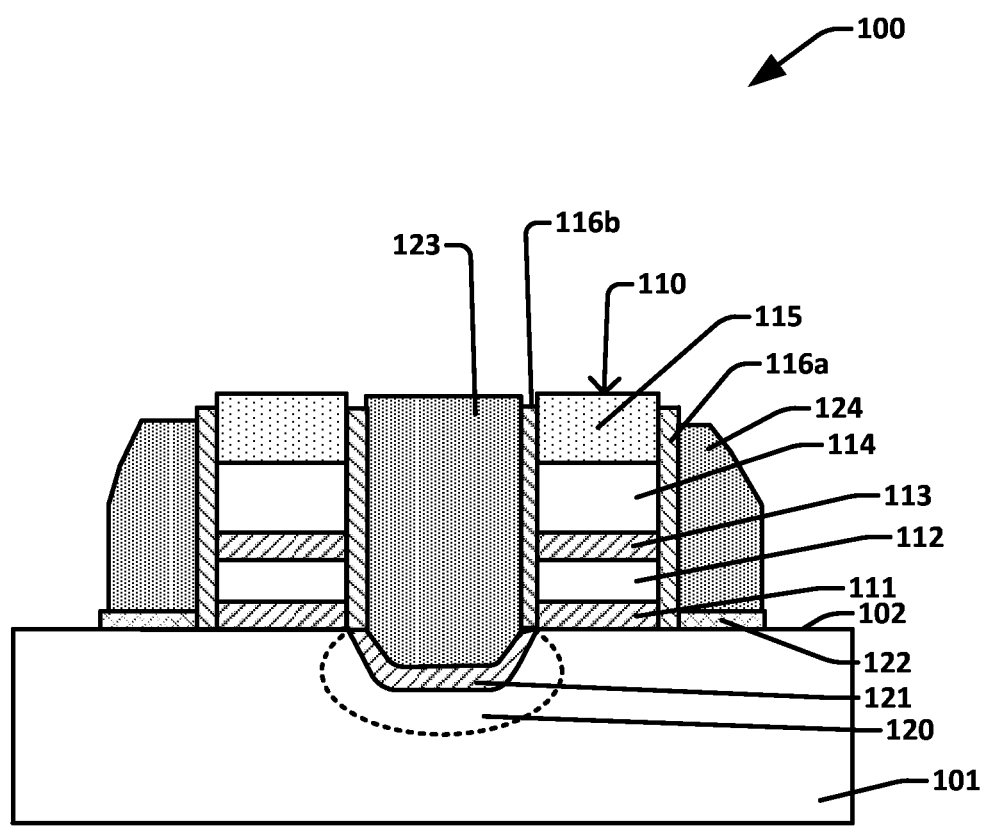
FIG. 1 shows some embodiments of a cross sectional view of a pair of adjacent memory cells of the present disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Split gate memory cells have promising advantages over stacked gate memory cells such as low power consumption, high injection efficiency, less susceptibility to short channel effects, and over erase immunity. A built in select gate transistor in a split gate memory cell can effectively get rid of the on-chip erase procedures that were used in traditional stacked gate cells to resolve over erase problems. Some prior art approaches utilize a common source (CS) diffusion along a single direction along an active region strip in an array that connects all the sources in that direction. The cell dimension in a direction of the control gates of two cells that share a common source may be limited by the width of the CS in active region which separates the control gates. Additionally, corner rounding of inner vertices of the CS within these structures can pinch off the channel and increase the channel resistance, which limits downscaling non-volatile memories that include split gate cells.

Accordingly, the present disclosure relates to an architecture to create split gate flash memory cell that has lower CS resistance and a reduced cell size by utilizing a buried common source structure. Here, active regions are separated from one another with isolation regions and since there are no active region corners in between two cells that share a common source, there is no corner rounding effect. Source line is a path between the control gates of a pair of split gate flash memory cells where source dopant ions are implanted. Further, to provide potential coupling during programming and erasing and thus electrically connect the common sources of memory cells along a direction that forms a common source (CS) line, the source ions are implanted continuously along the source line in a single step, creating a buried conductive path that connects all the sources. Hence there is no need for any other structures in between the stacked gate structures or above the sources for coupling the cells. This facilitates further reduction in the space between the gates of neighboring cells and thus the device could be shrunk further. A two-step etch process is carried out before the ion implantation which gives a deeper source implantation and a rounded etch profile that prevents current leakage. Thus, this particular architecture provides smaller cell size and more process margin compared to prior arts.

FIG. 1 shows some embodiments of a cross sectional view of a first pair of split gate flash memory cells 100 having a first shared common source (CS) region 120 in a semiconductor body 101. As will be demonstrated in subsequent embodiments, the first and second pairs of split gate flash memory cells reside on first and second active regions which are separated by an isolation region for electrical isolation of the first and second active regions. This isolation prevents the corner rounding effects and increased channel resistance observed in some prior art approaches. 102 represents the upper surface of the first active region of the first pair of split gate flash memory cells.

The first pair of split gate flash memory cells 100 further comprise a stacked gate structure 110 comprising a control gate 114 over a floating gate 112, separated by an insulating layer 113. A shared erase gate 123 resides on a side of the stacked gate structure above a source oxide 121 that isolates the erase gate from the CS region 120. A top surface 102 is assigned for the semiconductor body. The source implant is disposed under this top surface of the semiconductor body below the deep dish shaped etched surface. The source oxide 121 is disposed above the etched surface and the shared erase gate 123 right above the source oxide. Hence the erase gate extends deeper into the semiconductor body, below the top surface 102, unlike the other gate structures and insulating layers of the split gate memory cells. A select gate 124 resides on an opposite side of the stacked gate structure 110 from the erase gate 123. In some embodiments, the erase gate 123 and the select gate 124 comprise of polysilicon. A hard mask layer 115 resides above the stacked gate structure. A first spacer 116a and a second spacer 116b reside on either side of the stacked gate structure 110 and are configured to electrically isolate the stacked gate structure from the erase gate 123 and the select gate 124. A floating gate oxide layer 111 isolates the floating gate 112 from a channel region within the semiconductor body 101. A word line oxide layer 122 isolates the word line/select gate poly silicon layer 124 from the channel underneath.

Figure 2A:
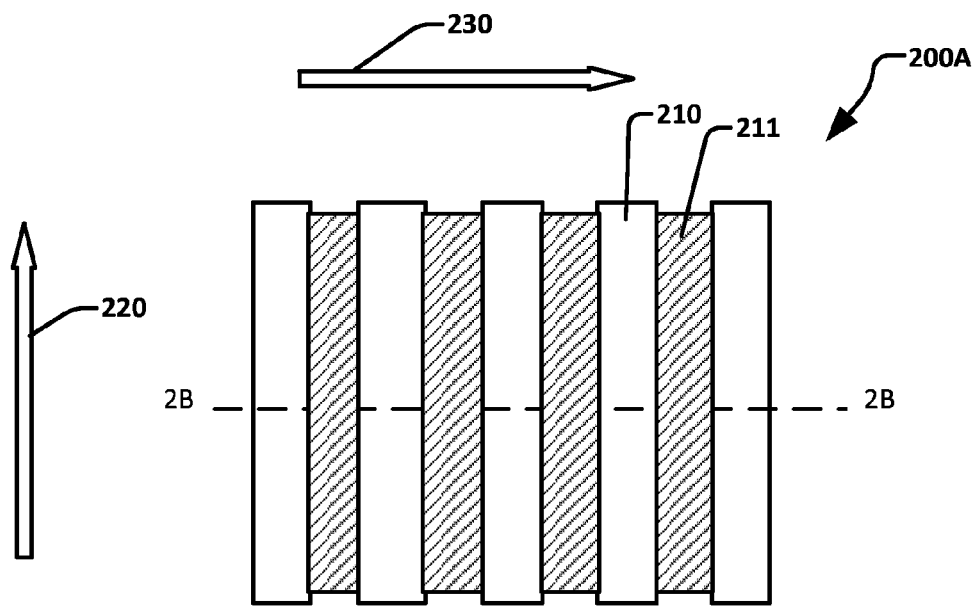
FIG. 2A shows a top view of some embodiments of a semiconductor surface with adjacent isolation regions along a first direction.
Figure 2B:
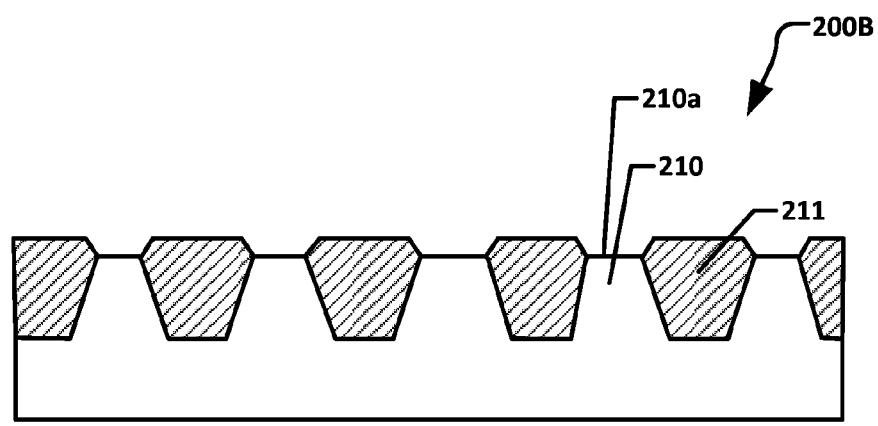
FIG. 2B shows a cross sectional view of the embodiments of FIG. 2A taken along 2B-2B.

FIG. 2A shows a top view of some embodiments of a semiconductor surface 200A with adjacent isolation regions along a first direction. The semiconductor surface 200A has been subjected to active module formation, wherein a plurality of isolation regions 211 are formed on the semiconductor body 210 and are oriented in a first direction 220. FIG. 2B shows a cross sectional view of a semiconductor surface 200B comprising the semiconductor surface 200A along 2B-2B of FIG. 2A. A semiconductor body 210 (e.g., a p-type semiconductor substrate) has a plurality of parallel adjacent isolation regions 211. An active region resides between two isolation regions 211. A top surface 210a is assigned for the active region 210. The plurality of isolation regions 211 creates a module that has alternate active and isolation regions. The isolation regions 211 may comprise simple shallow trench isolations (STI) regions, which are preferred over LOCOS (local oxidation of silicon), since they can be formed in smaller dimensions than LOCOS regions. STIs are formed by creating shallow trenches in the semiconductor body and filling it with a dielectric material, to isolate neighboring active regions. The active and isolation regions are disposed parallel to one another in a second direction 230 as shown in the embodiments of FIG. 2A.

Figure 3A:
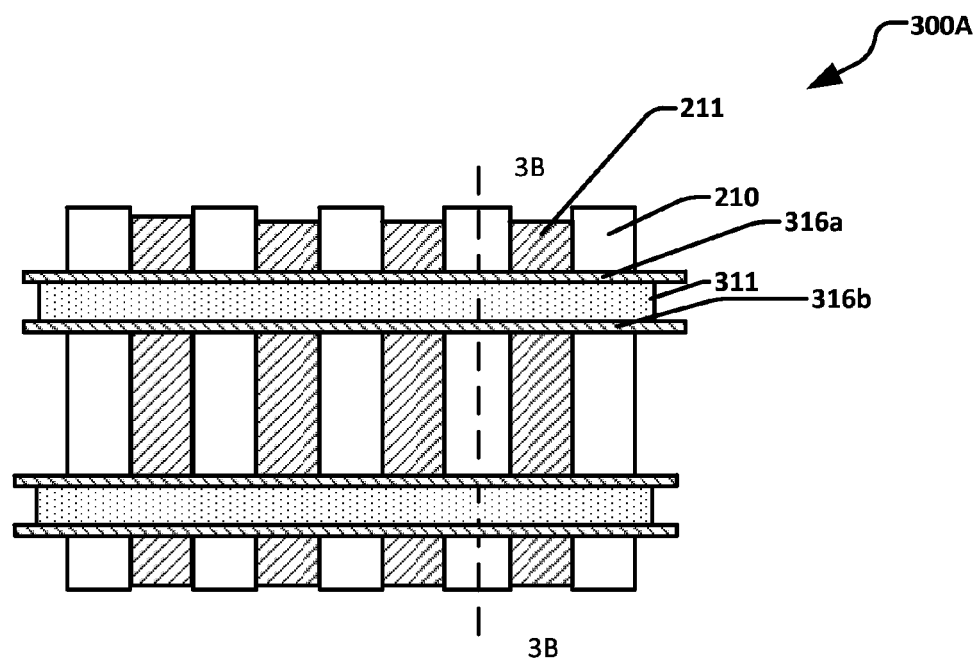
FIG. 3A shows a top view of some embodiments of a semiconductor surface after the formation of stacked gate structures.
Figure 3B:
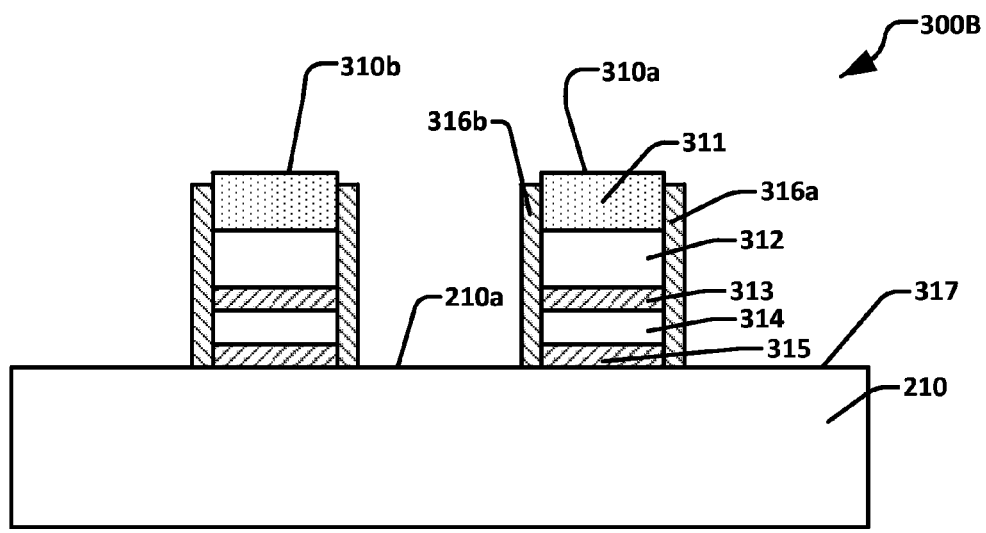
FIG. 3B shows a cross sectional view of a pair of split gate flash memory cells taken along 3B-3B of FIG. 3A.

FIG. 3A shows a top view of some embodiments of a semiconductor surface 300A after formation of stacked gate structures. A control gate hard mask layer 311 is formed above the semiconductor substrate 210. Side spacers 316a and 316b insulates the stacked gates from the neighboring layers. FIG. 3B shows a cross sectional view of a pair of split gate flash memory cells 300B taken along 3B-3B of FIG. 3A. The pair of split gate flash memory cells 300B comprises a first stacked gate structure 310a and a second stacked gate structure 310b on the active region 210. The first stacked gate structure 310a and the second stacked gate structure 310b are composed of a first oxide layer or floating gate oxide layer 315 disposed on top of the active layer, a floating gate poly layer 314 (e.g., poly silicon) disposed above the floating gate oxide layer 315, an insulating layer 313 (e.g., ONO) configured to insulate the floating gate poly layer 314 from a control gate poly layer 312, and the hard mask 311 (e.g., dielectric). A first spacer 316a and a second spacer 316b surround the first stacked gate structure 310a, and are configured to provide insulation from surrounding layers. 317 represents the upper surface of the semiconductor body. The fabrication process utilized, first forms these layers continuously over the semiconductor substrate 210, and then they are subsequently etched down using an anisotropic etch to create the first and second stacked gate structure 310a, 310b. Some anisotropic etching techniques comprise a wet etchant such as carbon tetrafluoride (CF4), HF, tetramethylammonium hydroxide (TMAH), or combinations of thereof for directional selectivity along different directions within the semiconductor substrate 210.

Figure 4A:
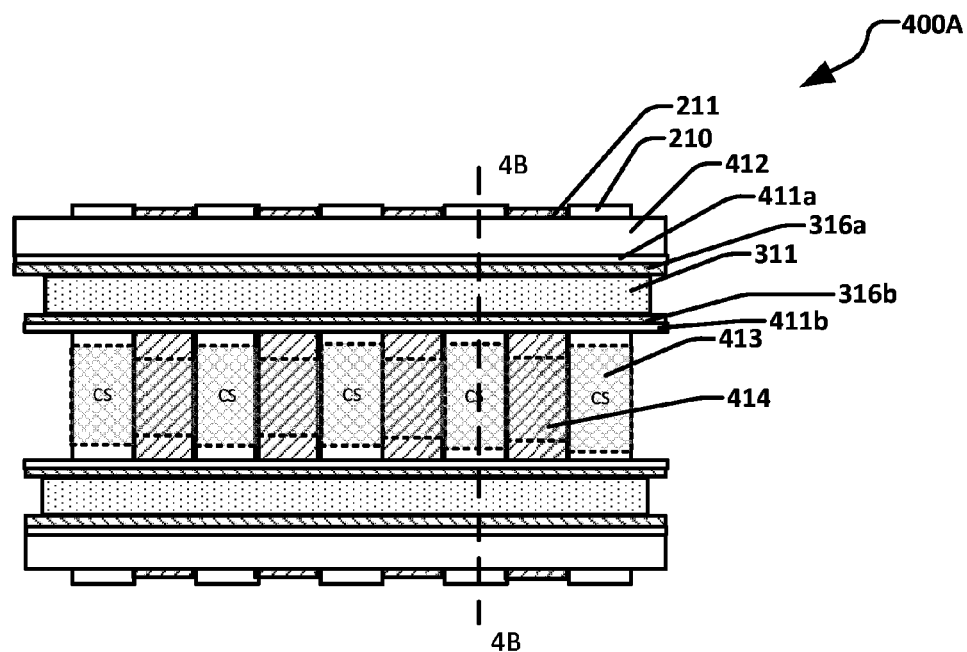
FIG. 4A shows a top view of some embodiments of a semiconductor surface after the HVII photo lithographic step, an extra etching step and an ion implantation step along the source line.
Figure 4B:
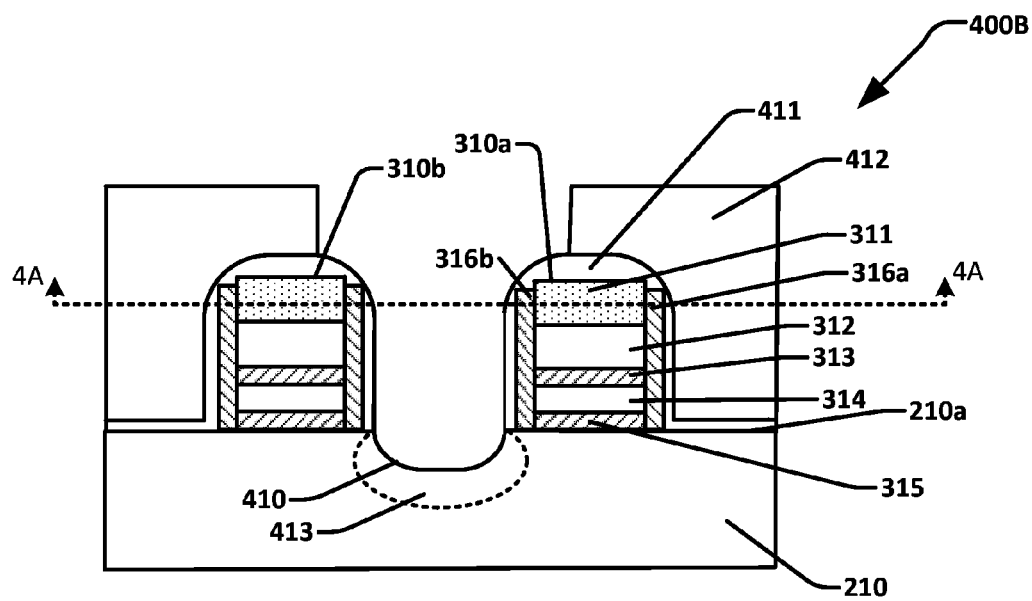
FIG. 4B shows a cross sectional view of the embodiments of FIG. 4A taken along 4B-4B.

FIG. 4A shows a top view of some embodiments of a semiconductor surface 400A taken along 4A-4A of FIG. 4B, after a two-step etch process and common source diffusion. After the formation of control gate spacers, their subsequent sidewall etch and a floating gate poly layer etch, a high voltage high temperature oxide (HV HTO) is deposited around the stacked gate structures. This protects the stacked gate structures along with their spacers from future extreme condition processing steps. 411a and 411b on either sides of the stacked gate structure 310a represents parts of the HTO over the semiconductor body. Before etching, the source line is pattered and opened up with the help of a photo lithographic step. 412 is a portion of the photoresist that covers 310a and helps in patterning the source line. The first of the two-step etch process, which is usually an anisotropic etch, will create a recess along the source line with shaped corners. A second source line etch, which is usually isotropic will produce rounded sidewalls and corners to the recess creating a dish shaped etch profile that extends below the top surface 210a. Following the etching, a heavy ion implantation (HVII) step creates common sources in the active regions and a conductive path in the STI regions. Source dopants comprising n+ ions for a p-type semiconductor substrate 210 are embedded between two stacked gate structures which form a pair of cells for a particular active layer in the first direction 220. A common source region 413 is formed between the first stacked gate structure 310a and the second stacked gate structure 310b following the ion implantation process. 414 represent the source ions in an STI region. The source diffusion is carried out in the second direction 230 which is transverse to the first direction 220, the first direction 220 being a direction of alignment of the split gate flash memory cells of each pair. For example, in some embodiments 230 could be a direction perpendicular to the first direction 220.

FIG. 4B shows a cross sectional view of a pair of split gate flash memory cells 400B taken along 4B-4B of FIG. 4A. Stacked gate structure 310a residing on the active region 210 is covered by HTO 411. Photoresist 412, patterned to create opening along the source line is seen covering 310a partially. 410 represents the final etch profile after the two-step etch process or the dish shaped surface. Source dopants are disposed below the dish shaped surface 410 in between the stacked gates 310a and 310b creating a source region 413. Stacked gate structure 310b has similar architecture and layers covering it as stacked gate structure 310a.

FIG. 5A shows a top view of some embodiments of a semiconductor surface 500A after the deposition and patterning of a poly silicon layer that leads to the formation of select and erase gates. The semiconductor surface 400A has been subjected to further fabrication steps which comprise formation of a source oxide, wordline (W/L) gate or select gate oxide, select (W/L) gates and erase gates. Multiple oxidation steps are carried out to create select gate oxide and source oxide. A third conductive layer or select gate poly silicon layer is deposited all over the semiconductor body, patterned and etched to form select gates 511a and 511b and erase gate 513. Here, 514 represents a first pair of split gate flash memory cells and 515, a second pair of split gate flash memory cells.

FIG. 5B shows a cross sectional view of the embodiments of FIG. 5A taken along 5B-5B, and comprises a pair of split gate flash memory cells 500B. The erase gate 513 and select gate 511a are disposed on either sides of the first stacked gate structure 310a. The source oxide 510 takes the shape of the surface below it and is disposed in a dish shape above the common source region 413 and below the erase gates 513. The select gate 511a is disposed above a W/L gate oxide layer 512.

FIG. 5C shows a cross sectional view of the embodiments of FIG. 5A taken along 5C-5C, and comprises a pair of split gate flash memory cells 500C. The erase gate 513 and select gate 511a are disposed on either sides of the first stacked gate structure 310a. The source oxide 510 is disposed above the common source region 413 and below the erase gates 513. The select gate 511a is disposed above a W/L gate oxide layer 512. Here, the stacked gate structures and the select gates are disposed above the STI region 211.

FIG. 5D shows a cross sectional view of the embodiments of FIG. 5A taken along 5D-5D, comprising the semiconductor body 500D. A semiconductor substrate 210 (e.g., a p-type semiconductor substrate) has a plurality of parallel adjacent isolation regions 211. An active region (OD) resides between two isolation regions 211. The plurality of isolation regions 211 creates a module that has alternate active and isolation regions. Source dopants (e.g., n+ ions for a p-type semiconductor substrate) reside just below the source oxide layer forming a layer of conductive ions that follows the shape of the OD and STI regions. The two-step etch helps disposing source ions below the level of the STI regions. Further, the recess helps the implanted ions to diffuse uniformly in the substrate as there are no obstructions of the stacked gate structures or other oxides on its sides. This will help create a channel with uniform thickness and density. The ions implanted on the top surface of the OD forms a common source 413 for split gate flash memory cells residing on that active layer. The ions implanted in the trenches along the STI region forms a buried doped conductive path 414 that couples two pairs of split gate flash memory cells along the second direction 230. Above the oxide layer 510, lies the poly silicon layer that forms the erase gate 513. The erase gate extends deep into the recess and covers all the source oxide and STI layers.

Figure 6:
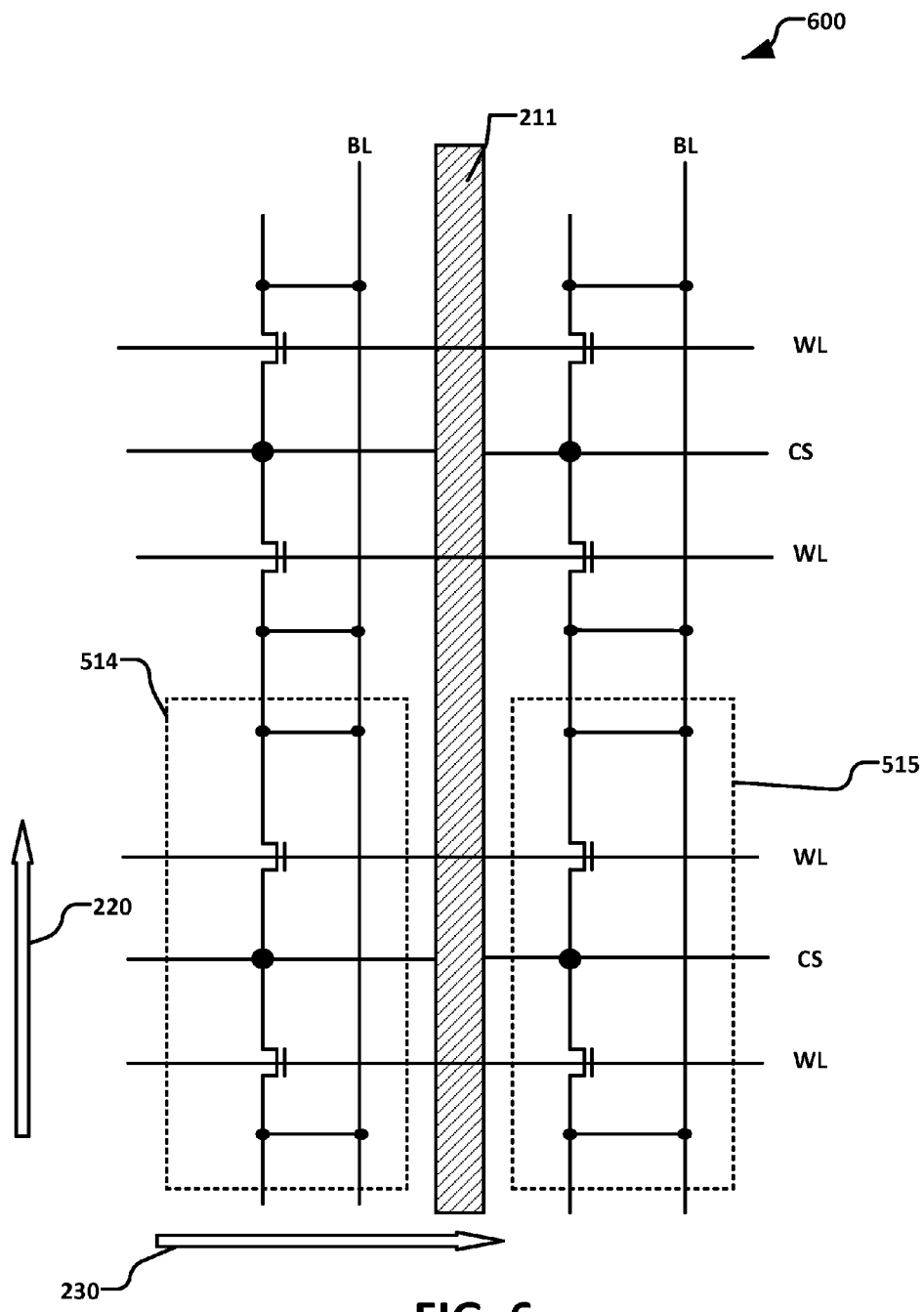
FIG. 6 shows a circuit diagram of some embodiments of a memory array of the embodiments of FIGS. 2A-5D.

FIG. 6 shows a circuit diagram 600 of some embodiments of a memory array of split gate flash memory cells of the embodiments of FIGS. 2A-5D. A first pair of split gate flash memory cells 514 shares a common source and are oriented in the first direction 220. A second pair of cells 515 also share a common source and are oriented in the first direction 220 and is separated from first pair of split gate flash memory cells 514 by an isolation region 211. The common sources of the pairs 514, 515 extends between the isolation region through the buried doped conductive layer oriented in the second direction 230, to form a common source (CS) line. The drains of a pair of cells in the first direction 220 are connected to form a bit line (BL). The gates of memory cells along 230 are connected to form a word line (WL). A plurality of such pairs can give rise to an array of memory cells. FIG. 6 represents such an array with 4 pairs of cells. During operation, control circuitry biases the WLs, BLs, and CS lines of the memory array according to pre-determined bias conditions to read and write individual data states to the individual cells. Programming is performed by means of source-side channel hot-electron injection. Poly-to-poly Fowler-Nordheim (FN) electron tunneling from the floating gate toward the neighboring select gate (W/L) is employed for erasing.

Figure 7:
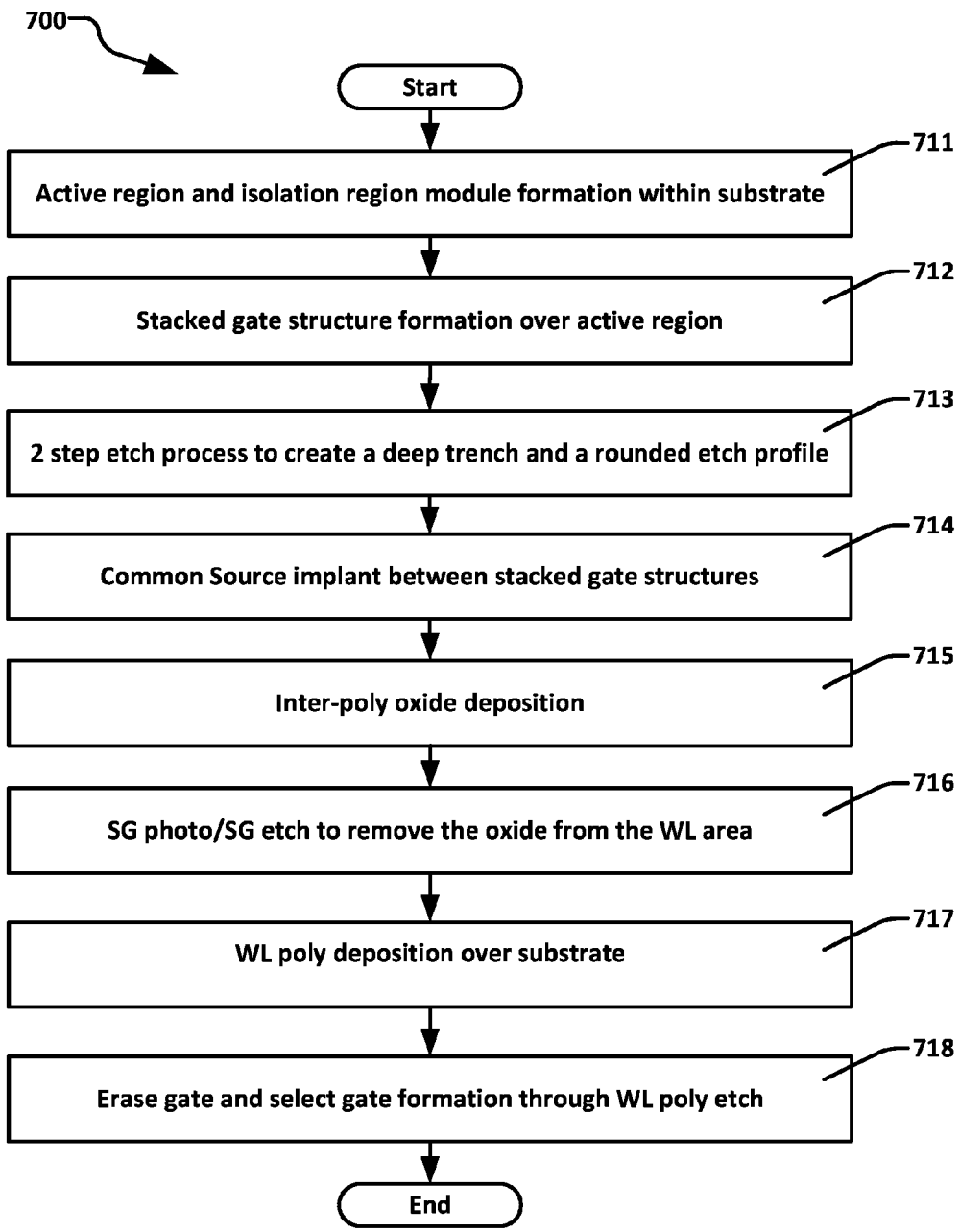
FIG. 7 shows a flow chart of a method according to some embodiments of the present disclosure.

FIG. 7 shows a flow chart of a method 700 according to some embodiments of the present disclosure. The method 700 is performed in accordance with the embodiments of FIGS. 2A-5D. It will be appreciated that in method 700, and subsequently in method 800, some of the steps or blocks may be further subdivided into multiple steps or blocks in some implementations, or may multiple illustrated steps or blocks can be combined in other implementations. Additional un-illustrated steps or blocks may also be present, and/or illustrated steps or blocks may be omitted in some implementations. Also, the order of the steps or blocks may be re-ordered in some embodiments. All such changes are contemplated as falling within the scope of the present disclosure.

At 711 a plurality of isolation regions (e.g., STIs) are disposed on a silicon substrate in an alternately repeating pattern of active and isolation zones in a first direction. In some embodiments, the substrate can be a semiconductor wafer such as a silicon (Si) or silicon-on-insulator (SOI) wafer, a binary compound substrate (e.g., GaAs wafer), a ternary compound substrate (e.g., AlGaAs), or higher order compound wafers, among others. Conventional methods of producing an isolation feature such as STI include forming a hard mask (e.g., silicon nitride, SiN) over a targeted trench layer which includes a thermally grown pad oxide layer, and patterning a photoresist layer over the hard mask to define a trench feature. After patterning, etching is performed through the openings in the hard mask to create recesses in the silicon regions of the silicon substrate. An insulating material, such as oxide or other suitable material, is deposited in the recesses and on the hard mask. A chemical mechanical planarization (CMP) is then performed to remove the insulator material on top of the hard mask and to planarize the top of the STI region. The chemical mechanical planarization stops on the hard mask. Following the planarization, the hard mask layer is removed from the top of the silicon substrate.

At 712 a stacked gate structure that comprises a floating gate and a control gate is formed, following a series of steps. Some of the important steps include, floating gate oxide layer formation, floating gate poly layer deposition, ONO formation, control gate poly layer deposition, control gate hard mask deposition, selective anisotropic etching and spacer formation.

At 713 a 2 step etch process is carried out to create a deep recess and a dish shaped etch profile. In some embodiments, the first etching step is usually an anisotropic etch. Anisotropic etching techniques are used in microfabrication processes to create well defined super microscopic features with a high aspect ratio. One or more etching processes may be used to form the recess, including dry etching process(es) such as a plasma etching, wet etching process(es), or a combination thereof. In some embodiments, the dry plasma etch comprises bombarding the substrate with ions (e.g., fluorocarbons, oxygen, chlorine, nitrogen, argon, helium, etc.) that dislodge portions of the material from the substrate 120. Wet etching may also be utilized to achieve an isotropic etch profile (rounded) in some embodiments. For example, an etchant such as carbon tetrafluoride ($CF_4$), HF, tetramethylammonium hydroxide (TMAH), or combinations of thereof, or the like may be used to perform the wet etch and form the recess in some embodiments. The second etch is to make sure the etch profile is rounded, so that leakage current is reduced. The etch profile in the STI region comprises a substantially flat bottom surface with vertical sidewalls.

At 714 common source diffusion is performed in such a way that a layer of conductive ions if formed right below the etched surface in the OD and STI regions. The ion implantation is carried out along the source line, which is the opened path between a pair of stacked gate structures in the first direction 220. A common source region (e.g., n+ ion impurities) is formed in between the stacked gate structures of a pair of split gate flash memory cells on one active region and, the channel of implanted ions in the STI region forms a buried doped conductive path that connects two common sources of two pairs of split gate flash memory cells in the second direction 230.

At 715 an inter poly oxide deposition is carried out which forms a layer of source oxide above the source line and on the inner sidewalls of the stacked gate structures of a pair of split gate flash memory cells. This layer insulates the common source, the buried conductive path and the inner walls of the stacked gate structure from the future poly silicon layers.

At 716 a SG photo/SG etch step is performed to remove and pattern the oxide in the SG (select gate) or WL (word line) area. After the oxide in the SG area is removed using SG etch, a new SG oxide (WL oxide) is deposited in the same area. This layer of SG oxide will provide insulation for the select gates from the channel underneath. In some embodiments, the SG etch would include a dry+ wet (HF dip) approach to remove the SG oxide.

At 717 a W/L poly layer is deposited above the whole wafer surface.

At 718 a photolithographic step (WL poly etch) that includes an anisotropic etch is carried out to pattern the W/L poly in to select and erase gates. A set of select gates on opposite sides of a stacked gate pair and a shared erase gate between the stacked gate pair, wherein the shared erase gate resides above the dish shaped oxide layer and extends below the top surface is formed.

Figure 8:
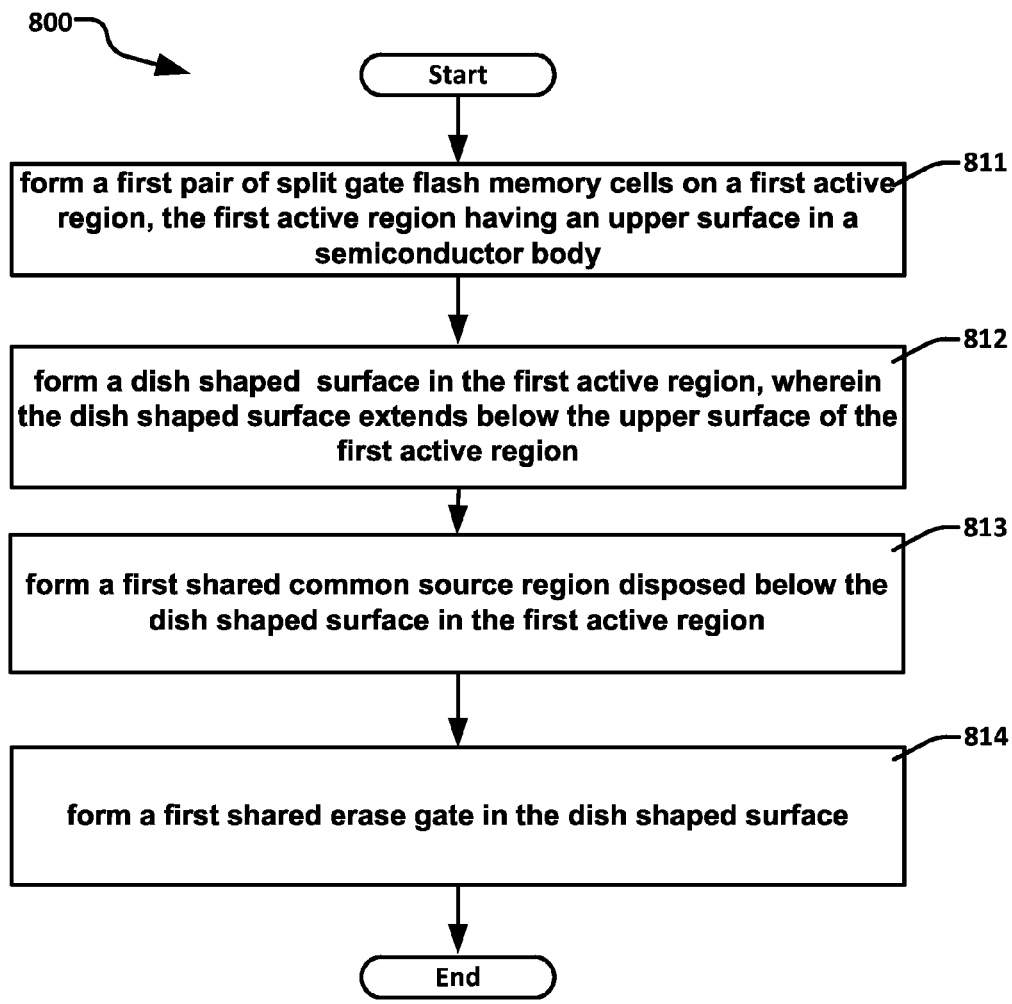
FIG. 8 shows a flow chart of a method according to some embodiments of the present disclosure.

FIG. 8 shows a flow chart of a method 800 performed in accordance with the embodiments of FIGS. 2A-5D.

At 811 a first pair of split gate flash memory cells having an upper surface is formed on a first active region on a semiconductor body.

At 812 a dish shaped surface is formed in the first active region which extend below the upper surface of the first active region. A two-step etch process is carried out to create this etched surface in between the stacked gate structures of the split gate memory cells. In some embodiments one or more etching processes may be used to form the recess, including dry etching process(es) such as a plasma etching, wet etching process(es), or a combination thereof. Here, an anisotropic etch followed by an isotropic etch creates the dish shape.

At 813, a first shared common source region is formed below the dish shaped surface in the first active region.

At 814, a first shared erase gate is formed in between the stacked gate structures. The erase gate is formed after deposition and patterning of a poly silicon layer over the semiconductor body.

It will also be appreciated that equivalent alterations or modifications may occur to one of ordinary skill in the art based upon a reading or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features or aspects of other implementations as may be desired. Furthermore, to the extent that the terms "includes", "having", "has", "with", or variants thereof are used herein; such terms are intended to be inclusive in meaning—like "comprising." Also, "exemplary" is merely meant to mean an example, rather than the best. It is also to be appreciated that features, layers or elements depicted herein are illustrated with particular dimensions or orientations relative to one another for purposes of simplicity and ease of understanding, and that the actual dimensions or orientations may differ substantially from that illustrated herein.

Therefore, the present disclosure relates to an architecture to create split gate flash memory cell that has lower CS resistance and a reduced cell size by utilizing a buried common source structure. The source ions are implanted beneath a recessed source line inside the substrate which allows a uniform and unobstructed source diffusion. Source implant also forms a conductive path beneath the STI region that connects two split gate flash memory cells and provide potential coupling during programming and erasing and thus electrically connect the common sources of memory cells along a direction that forms a CS line. Thus no external contact pads or connections goes in between the stacked gate structures to connect the sources which allows us to shrink the device further. The architecture contains no OD along the source line between the cells, thus eliminating the effects of CS rounding and CS resistance, resulting in a reduced space between cells in an array. Hence, this particular architecture reduces the resistance and the buried common conductive path between several cells in an array suppresses the area over head.

In some embodiments, the present disclosure relates to a memory device comprising a first pair of split gate flash memory cells residing within a first active region, the first active region having an upper surface in a semiconductor body, wherein the first pair of split gate flash memory cells share a first shared erase gate having a dish shaped surface that extends below the upper surface of the first active region, and a first shared common source region disposed below the dish shaped surface of the first erase gate in the first active region.

In some embodiments, the present disclosure relates to a memory device comprising a first pair of split gate flash memory cells residing within a first active region, having a first shared common source region disposed below a dish shaped surface in the first active region, and a second pair of split gate flash memory cells residing within a second active region, having a second shared common source region disposed below a dish shaped surface in the second active region, wherein the second pair of split gate flash memory cells is isolated from the first pair of split gate flash memory cells by a shallow trench isolation region, wherein the first shared common source region and the second shared common source region are connected by a buried conductive path which is formed as a single doped layer extending between the first and second shared common source regions and wherein the buried conductive path is disposed under the shallow trench isolation region.

In some embodiments, the present disclosure relates to a method of forming a memory device comprising, forming a first pair of split gate flash memory cells on a first active region, the first active region having an upper surface in a semiconductor body, forming a dish shaped surface in the first active region, wherein the dish shaped surface extends below the upper surface of the first active region, forming a first shared common source region disposed below the dish shaped surface in the first active region, and forming a first shared erase gate in the dish shaped surface.

What is claimed is:
1. A memory device comprising:
  a first pair of split gate flash memory cells residing within a first active region, the first active region having an upper surface in a semiconductor body, wherein the first pair of split gate flash memory cells share a first shared erase gate having a dish shaped surface that extends below the upper surface of the first active region;
  a first shared common source region disposed below the dish shaped surface of the first erase gate in the first active region;

a second pair of split gate flash memory cells residing within a second active region, the second active region having an upper surface in the semiconductor body, wherein the second pair of split gate flash memory cells share a second shared erase gate having a dish shaped surface that extends below the upper surface of the second active region;

a second shared common source region disposed below the dish shaped surface of the second erase gate in the second active region;

an isolation region disposed within a trench in the semiconductor body separating the first and second active regions; and a buried doped conductive path disposed beneath the isolation region extending between the first and second shared common source regions, wherein the buried doped conductive path has an undulating shape, following an inner profile of the trench.

2. The memory device of claim 1, wherein the first shared common source region, the second shared common source region, and the buried doped conductive path comprise a single doped layer in the semiconductor body.

3. The memory device of claim 1, further comprising:
an oxide layer separating the first erase gate and the first shared common source region, wherein the oxide layer is disposed over a dish shaped etch profile on the first active region.

4. The memory device of claim 1, wherein the first and second active regions and the isolation region extend in a first direction on the semiconductor body, and a plurality of such first and second active regions and isolation regions reside together to form an array of split gate flash memory cells.

5. The memory device of claim 1, wherein the first and second active regions and the isolation region extend in a first direction on the semiconductor body and wherein the buried doped conductive path extends in a second direction that is transverse to the first direction and connects the common sources of the first and second active regions to form a source line.

6. The memory device of claim 1, wherein the first and second pairs of split gate flash memory cells each comprise:
a pair of stacked gate structures, each stacked gate structure comprising a control gate over a floating gate; and
a select gate on opposite sides of the pair of stacked gate structures.

7. A memory device disposed on a semiconductor substrate comprising:
a first pair of split gate flash memory cells residing within a first active region, having a first shared common source region disposed below a dish shaped surface in the first active region; and
a second pair of split gate flash memory cells residing within a second active region, having a second shared common source region disposed below a dish shaped surface in the second active region, wherein the second pair of split gate flash memory cells is isolated from the first pair of split gate flash memory cells by a shallow trench isolation region;
wherein the first shared common source region and the second shared common source region are connected by a buried conductive path which has an undulating shape and is disposed under the shallow trench isolation (STI) region.

8. The memory device of claim 7, wherein the first and second pairs of split gate flash memory cells each extend in a first direction, and wherein the buried conductive path is disposed in a semiconductor body and is formed after etching the shallow trench isolation region, and wherein the buried conductive path is oriented in a second direction which is transverse to the first direction.

9. The memory device of claim 7, wherein a source oxide layer is disposed over a dish shaped surface in each of the first and second active regions.

10. The memory device of claim 7, wherein the buried conductive path is a doped region of the semiconductor substrate.

11. The memory device of claim 7, wherein the first and second shared common source regions and the buried conductive path are continuous with one another.

12. The memory device of claim 7, wherein:
the first pair of split gate flash memory cells includes a first pair of floating gates, respectively, which are disposed over an upper surface of the first active region, and includes a first pair of control gates, respectively, which are disposed over the first pair of floating gates, respectively; and
the second pair of split gate flash memory cells includes a second pair of floating gates, respectively, which are disposed over an upper surface of the second active region, and includes a second pair of control gates, respectively, which are disposed over the second pair of floating gates, respectively.

13. A split gate flash memory device, comprising:
a first pair of split gate flash memory cells which are disposed over an upper surface of a semiconductor body, wherein the upper surface of the semiconductor body exhibits a first recessed region which is arranged between the first pair of split gate flash cells and which extends below the upper surface of the semiconductor body;
a first common source region which is disposed in the first recessed region of the semiconductor body below the upper surface of the semiconductor body and which is common to first pair of split gate flash memory cells;
an erase gate which is disposed over the first recessed region and which has a dish-shaped lower surface that extends below the upper surface of the semiconductor body;
a conformal dielectric layer disposed in the first recessed region of the semiconductor body and separating the first common source region from the erase gate;
a second pair of split gate flash memory cells spaced laterally apart from the first pair of split gate flash memory cells and a second recessed region arranged between the second pair of split gate flash cells;
a second common source region disposed in the second recessed region of the semiconductor body below the upper surface of the semiconductor body;
a conductive path disposed in the semiconductor body electrically connecting the first and second common source regions, the conductive path having an undulating shape along a direction which is perpendicular to an orientation of split gate flash memory cells of each pair; and
an isolation region disposed within a trench in the semiconductor body and separating active regions of the first and second pairs of split gate flash memory cells;
wherein the conductive path extends beneath the isolation region to couple the first and second common source regions to one another.

14. The memory device of claim 13, wherein the conformal dielectric layer comprises silicon dioxide.

15. The split gate flash memory device of claim 13, wherein the conductive path is a doped surface region of the semiconductor body.

16. The memory device of claim 15, wherein the first and second common source regions and the conductive path are continuous with one another.

17. The split gate flash memory device of claim 13, wherein the erase gate extends continuously between the first and second pairs of split gate flash memory cells.

18. The split gate memory device of claim 13, wherein:
the first pair of split gate flash memory cells includes a first pair of floating gates, respectively, which are disposed over the upper surface of a semiconductor body, and includes a first pair of control gates, respectively, which are disposed over the first pair of floating gates, respectively.

19. The split gate flash memory device of claim 18, further comprising:
a first pair of select gates disposed along respective outer sidewalls of the first pair of floating gates, respectively; and
a horizontal dielectric separating the first pair of select gates from the upper surface of the semiconductor body and a vertical dielectric separating the first pair of select gates from the first pair of floating gates, respectively.

20. The split gate memory device of claim 13, wherein:
the second pair of split gate flash memory cells includes a second pair of floating gates, respectively, which are disposed over the upper surface of a semiconductor body, and includes a second pair of control gates, respectively, which are disposed over the second pair of floating gates, respectively.

* * * * *